United States Patent
Chi et al.

(10) Patent No.: US 10,658,276 B2
(45) Date of Patent: May 19, 2020

(54) DEVICE WITH TOP-SIDE BASE PLATE

(71) Applicant: Tesla, Inc., Palo Alto, CA (US)

(72) Inventors: William Thomas Chi, Fremont, CA (US); Mehmet Ozbek, San Francisco, CA (US); Satish Thuta, San Jose, CA (US)

(73) Assignee: Tesla, Inc., Palo Alto, CA (US)

( * ) Notice: Subject to any disclaimer, the term of this patent is extended or adjusted under 35 U.S.C. 154(b) by 201 days.

(21) Appl. No.: 15/434,133

(22) Filed: Feb. 16, 2017

(65) Prior Publication Data

US 2017/0236773 A1  Aug. 17, 2017

Related U.S. Application Data (60) Provisional application No. 62/296,020, filed on Feb. 16, 2016.

(51) Int. Cl.
| | |
|---|---|
| *B23P 19/00* | (2006.01) |
| *H01L 23/495* | (2006.01) |
| *H01L 21/50* | (2006.01) |
| *H01L 23/31* | (2006.01) |
| *H01L 23/433* | (2006.01) |

(52) U.S. Cl.
CPC ........ *H01L 23/49568* (2013.01); *H01L 21/50* (2013.01); *H01L 23/49551* (2013.01); *H01L 23/3107* (2013.01); *H01L 23/4334* (2013.01); *H01L 2224/32245* (2013.01); *H01L 2224/48247* (2013.01); *H01L 2224/73265* (2013.01); *H01L 2224/92247* (2013.01); *H01L 2924/14* (2013.01); *H01L 2924/1815* (2013.01); *Y10T 29/53178* (2015.01)

(58) Field of Classification Search
CPC ....... H01L 2023/4043; H01L 2023/405; H01L 2023/4037; H01L 2023/4062; H01L 33/64; H01L 2023/4056; H01L 21/4882; H05K 3/0061; H05K 2201/066; H05K 2201/10969; H05K 2201/10962; H05K 1/021; H05K 1/0201; H05K 7/20436; Y10T 29/4913; Y10T 29/49133; Y10T 29/53178
USPC ......... 29/834, 832, 841, 846, 729, 740, 739, 29/741

See application file for complete search history.

(56) References Cited

U.S. PATENT DOCUMENTS

| | | | | |
|---|---|---|---|---|
| 2006/0274512 A1* | 12/2006 | Brandenburg | ......... | H01L 23/36 361/760 |
| 2008/0157433 A1* | 7/2008 | Heng | ..................... | H01L 21/56 264/259 |
| 2009/0002963 A1* | 1/2009 | Cooney | ............... | H01L 23/3735 361/771 |
| 2010/0321894 A1* | 12/2010 | Wang | .................. | H01L 23/4093 361/709 |

* cited by examiner

*Primary Examiner* — Thiem D Phan
(74) *Attorney, Agent, or Firm* — Knobbe, Martens, Olson & Bear, LLP (57) ABSTRACT

A device includes an integrated circuit (IC) die, a top-side base plate to which the IC die is mounted, and a body attached to the top-side base plate such that the IC die is inside the body, the body configured for attachment to a printed circuit board (PCB) such that the top-side base plate faces away from the PCB. The device may or may not include legs that abut the PCB upon installation.

19 Claims, 9 Drawing Sheets

DEVICE WITH TOP-SIDE BASE PLATE

CROSS REFERENCE TO RELATED APPLICATION

The present U.S. Utility Patent Application claims priority pursuant to 35 U.S.C. § 119(e) to U.S. Provisional Application No. 62/296,020, entitled "DEVICE WITH TOP-SIDE BASE PLATE," filed Feb. 16, 2016, which is hereby incorporated herein by reference in its entirety and made part of the present U.S. Utility Patent Application for all purposes.

BACKGROUND

Electronic devices often have one or more integrated circuit (IC) components that perform various functions. Such components can be mounted onto a printed circuit board (PCB) as a way of keeping components in place, as well as to provide electrical and thermal contact to and from the components. One traditional way of installing a device onto the PCB is to have a top-side base plate of the housing face toward the PCB when installed. That is, the top-side base plate can be a generally planar surface on the housing wherein an IC die—usually the main part of the device itself—is mounted inside the housing on the opposite side of the top-side base plate. That is, this installation places the IC die and the top-side base plate essentially onto the PCB in the desired location, which facilitates electrical connection and some amount of heat transfer, to be discussed below. The device can then have pins connected to the IC die by wire bonding, the pins extending through the side of the housing and down onto the PCB. Essentially, the pins can extend toward the plane of the heat transfer surface.

IC dies often create significant heat when used. Because the device itself and/or nearby components can be sensitive to excessive heat, it may be necessary to provide for heat removal from the device. However, the heat conduction through a regular PCB may not be sufficient. Due to this, a "coin" made of copper or other heat conducting layer is sometimes installed in the PCB directly underneath the device to improve the heat conduction and to provide electric connection. However, using coins can add unwanted cost to, and/or can restrict the density of, the circuit design.

Another existing approach involves cutting a hole in the PCB and partially embedding the device therein so that the leads come out exposed on the side(s) of the device. Below such a PCB, a platform can be raised to contact the bottom of the device and serve as a heat sink. That is, this example also involves some form of top-side base plate to which the IC die is mounted (inside the device), and the device is installed so that the top-side base plate is essentially near the surface of the PCB. However, this approach can also add unwanted cost and/or restrict component density.

Another existing approach involves, like the ones above, a packaging in which the top-side base plate on which the IC die is mounted resting onto the PCB. On top of the IC die and inside the packaging of the device, a metal member is positioned that extends through the wall of the housing and forms an exposed, upwardly facing surface. However, this approach also has the disadvantage that the top-side base plate with the IC die are mounted essentially in direct contact with the PCB which as mentioned is usually not a good thermal conductor.

DETAILED DESCRIPTION

This document describes examples of systems and techniques for providing an installation of a device on a PCB such that the installation is thermally efficient in terms of removing heat from the device, without introducing complexities in the PCB or the installation process. In some implementations, the device is manufactured so that the top-side base plate, which traditionally has been facing downward and essentially abutting the PCB, is intentionally placed on top of the device, thereby facilitating heat removal while protecting the die against damage.

In some implementations, the packaging is configured so that pins of the device point in a direction away from the heat transfer surface. In other implementations, the traditional style of packaged IC die is modified to have the pins extend in the opposite direction than usual, thereby allowing the packaged device to essentially be installed upside down on the PCB and providing a top-side base plate that faces upward. For example, a thermally conductive structure such as a metal clip can then be applied to the packaging to help spread the heat from the device. In either of these approaches, the upward-facing top-side base plate—which is near the source of heat because it has the IC die attached thereto—faces away from the PCB and can therefore expediently be contacted with a heatsink to remove heat, which may be a heatsink clip.

The terms "top" and "bottom" and "up" and "down" are used herein for illustrative purposes only and do not indicate the absolute orientation of any component or part thereof. For example, the side of a device that directly abuts the surface of a PCB is herein sometimes referred to as the bottom surface, regardless of the overall orientation of the device-PCB assembly. Similarly, the side of a device that is on the opposite side of such a bottom surface, and therefore faces away from the surface of the PCB, is sometimes herein referred to as the top surface, again only indicating the orientation relative to the PCB. The terms up and down are used in a similar sense herein.

The present subject matter relates to electronic components that have one or more IC dies. Such a device can be used as a switch, including but not limited to a MOSFET, IGBT, or diode switch. In some implementations, this switching technology is used in form of one or more discrete components of a power electronics system. The power electronics can be used in an electric vehicle or in a stationary storage system for electric energy, to name just two examples. In a first aspect, a device comprises: an integrated circuit (IC) IC die; a top-side base plate to which the IC die is mounted; and a body attached to the top-side base plate such that the IC die is inside the body, the body configured for attachment to a printed circuit board (PCB) such that the top-side base plate faces away from the PCB.

The heatsink clip, if included, may be in contact with or connected to the top-side base plate on an opposite side of where the IC die is mounted. Connection may include but is not limited to thermal and/or electrical interface material such as solder. The device may further include legs on the body configured for abutting the PCB, the legs positioned on an opposite side of the body from the top-side base plate. The legs may be configured to provide separation of a heatsink from the PCB. The legs may be configured to provide space for mounting a component onto the PCB underneath the body. The device may further include one or more leads on the top-side base plate, the leads extending toward, and configured for abutting, the PCB. The top-side base plate may have one or more leads positioned on one or more edges of the top-side base plate that overhangs a side of the body. The one or more leads are configured to provide thermal and/or electrical contact between the top-side base plate and the PCB. The device further comprises a IC die bed on the top-side base plate, wherein the IC die is attached to the IC die bed. The IC die is essentially centered on the top-side base plate. The heatsink clip device further includes a clip configured to essentially cover the top-side base plate on an outside of the body, the clip having at least two clip ends extending down across side of the body and configured for abutting the PCB. The body comprises packaging that encloses the IC die. The packaging has pins extending in an opposite direction from a planar surface of the packaging where the IC die is located, the pins extending toward, and configured for abutting, the PCB. The top-side base plate is part of a lead frame made from copper, and wherein the body is made from a resin.

Figure 1A:
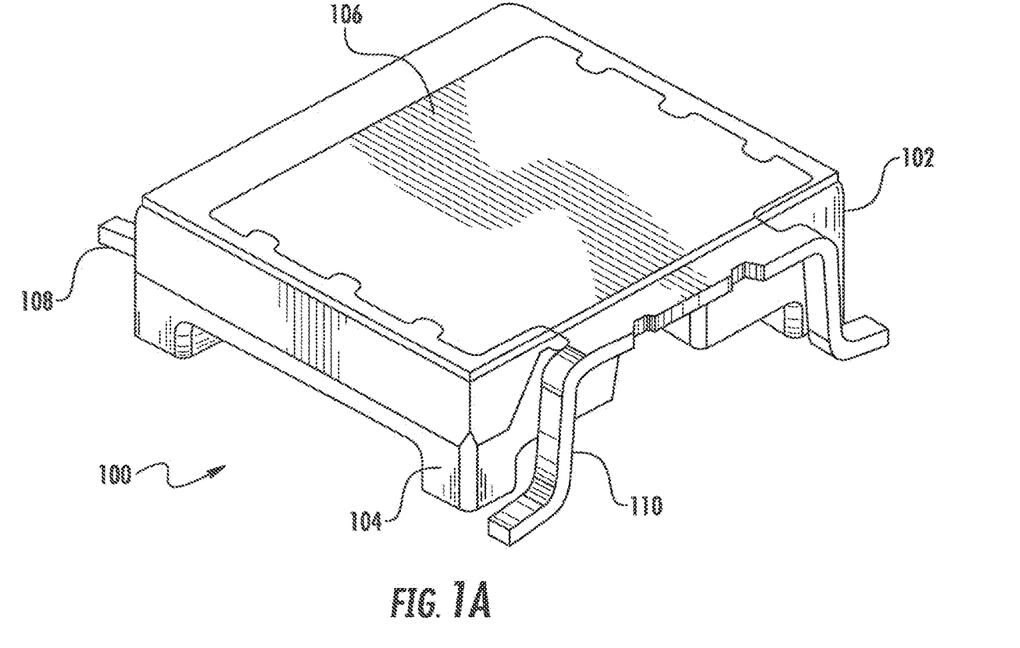
FIGS. 1A-B show respective perspective views of an example of a device constructed according to one or more embodiments of the present disclosure.
Figure 1B:
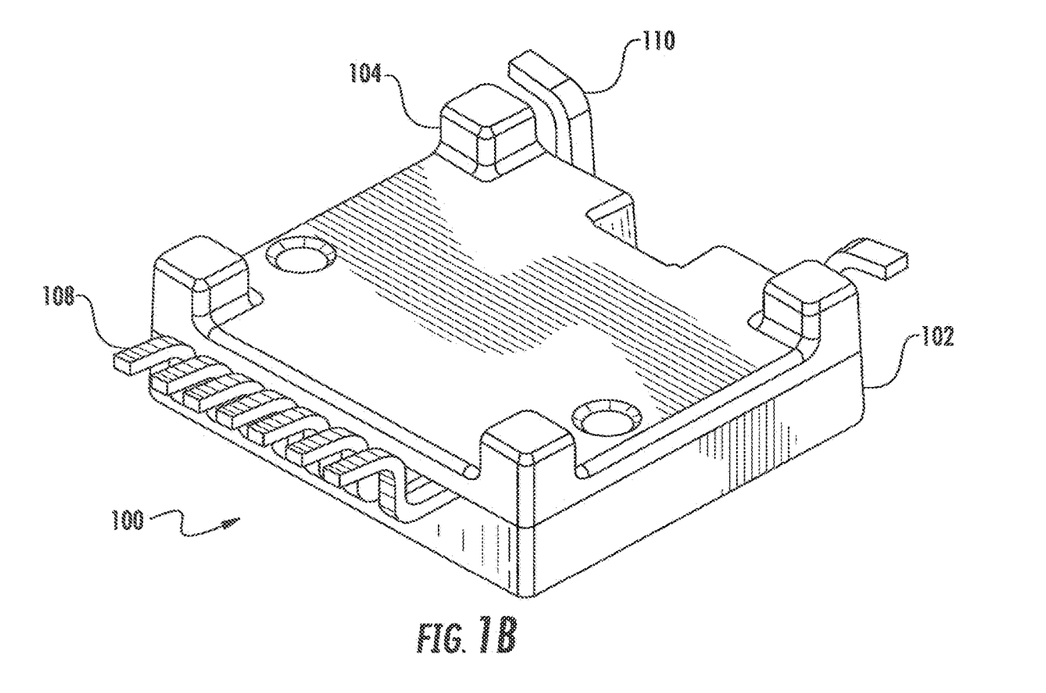

FIGS. 1A-B show respective perspective views of an example of a device 100 constructed according to one or more embodiments of the present disclosure. FIG. 1A shows the device 100 in an orientation for placement onto the top of an essentially horizontal surface, such as a PCB (not shown). FIG. 1B shows the device 100 from the opposite view, as if viewed from the perspective of the PCB (not shown). These orientations are shown for illustrative purposes only.

The device 100 has a body 102. In some implementations, the body 102 is a molded part, for example made from a resin. The body 102 forms the packaging for the device 100 and serves to enclose certain parts thereof while allowing other parts to be exposed for thermal and/or electrical connection.

The body 102 can have any number of legs extending therefrom. Here for example, legs 104 are positioned essentially at each of the respective four corners of the body 102. The legs 104 are configured to abut (e.g., stand on) the surface of the PCB. In some implementations, the legs 104 are formed as part of a molding process. For example, each leg 104 can have an essentially square cross section. Legs 104 may be omitted entirely to reduce height of device as will be further disclosed herein with reference to FIGS. 9A-10.

The device 100 also has a top-side base plate 106. The top-side base plate 106 is referred to as a top-side base plate 106 because it is positioned on the top of the device 100 relative to the PCB. The top-side base plate 106 can be part of a lead frame for the device 100. In some implementations, the top-side base plate 106 is made of metal, such as copper. The top-side base plate 106 can provide electric and/or thermal contact for the device 100.

An IC die (not shown in FIGS. 1A and 1B but shown in later FIGs.) is positioned inside the body 102, on an opposite side of the top-side base plate 106. In some implementations, the IC die is directly or indirectly attached to the inward surface of the top-side base plate 106. As such, the top-side base plate 106 can receive a significant share of the heat generated by the IC die in operation. For example, the top-side base plate 106 can be considered the main heat transfer surface of the device 100. As is described below, the position of the top-side base plate 106 on top of the body 102 can facilitate efficient heat removal through the top-side base plate 106.

The device has pins 108 extending from the body 102, which are electrical connections to/from the IC die. In some implementations, the pins 108 have an arrangement corresponding to respective leads on the PCB (not shown), to facilitate connection of each individual pin. For example, the device 100 can have a standard 7-pin solder connections to the PCB. Inside the body 102 of the device 100, the other ends of the pins 108 are connected to respective terminals on the IC die, for example by wire bonding. That is, the pins 108 can in a sense originate at or near the IC die on the inside of the top-side base plate 106 and can then extend in a direction away from the plane of that heat transfer surface so that they can be soldered to the PCB.

The top-side base plate 106 can have one or more leads 110. Here, the top-side base plate 106 has one or more leads 110 that can facilitate thermal and/or electrical connection of the top-side base plate, such as to the PCB. In some implementations, the leads 110 can extend from an edge of the top-side base plate 106. For example, the edge can overhang one of the sides of the body 102. The leads 110 can be formed as an integral part of the top-side base plate 106 or can be attached thereto.

That is, the device 100 can provide the advantage that the top-side base plate 106 is facing away from the PCB and is therefore more susceptible to have heat removed from it. Another advantage can be that the body 102 exposes essentially no conductive surfaces on its side walls, such as by the absence of copper surfaces. For example, the edges of the top-side base plate 106 can be enclosed by the body 102 so that only the top surface thereof is exposed. In some implementations, this can facilitate a closer placement of the device 100 and other components, such as in an array.

Figure 2:
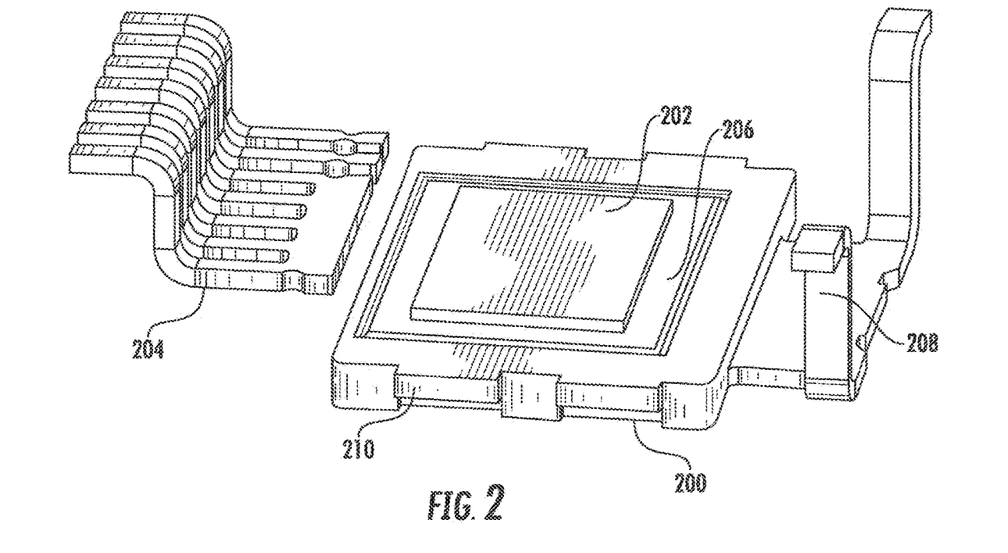
FIG. 2 shows an example of a lead frame, an IC die, and pins according to one or more embodiments of the present disclosure.

FIG. 2 shows an example of a lead frame 200, an IC die 202, and pins 204 according to one or more embodiments of the present disclosure. The lead frame 200 is here an integral metal component of a thermally and/or electrically conductive material, such as copper. The lead frame 200 is shown before being assembled into a device. Here, the IC die 202 is positioned on a IC die bed 206 on the inside of the top-side base plate surface. For example, the IC die bed is formed integrally with the lead frame 200.

The pins 204 are shown without connections to the IC die 202 or the rest of the lead frame, for illustrative purposes. During installation, moreover, the pins 204 will be electrically connected to the IC die 202 in one or more places. For example, wire bond connections can be created.

The lead frame 200 has leads 208 extending from the top-side base plate 106. In some implementations, the leads 208 extend from an edge of the top-side base plate that is intended to overhang a side of the assembled device so as to allow the leads to extend toward the PCB. For example, the leads 208 can be essentially perpendicular to the top-side base plate or the rest of the lead frame. The leads 208 can be soldered to the same PCB as the pins 204.

The lead frame 200 can be shaped so as to facilitate the combination with the body 102 into a packaged device. In some implementations, the top-side base plate 106 can have one or more teeth 210 on its side. For example, these teeth 210 can interact with a molded part so as to prevent inadvertent dislocation of the top-side base plate 106 and/or the body 102 after installation.

Figure 3:
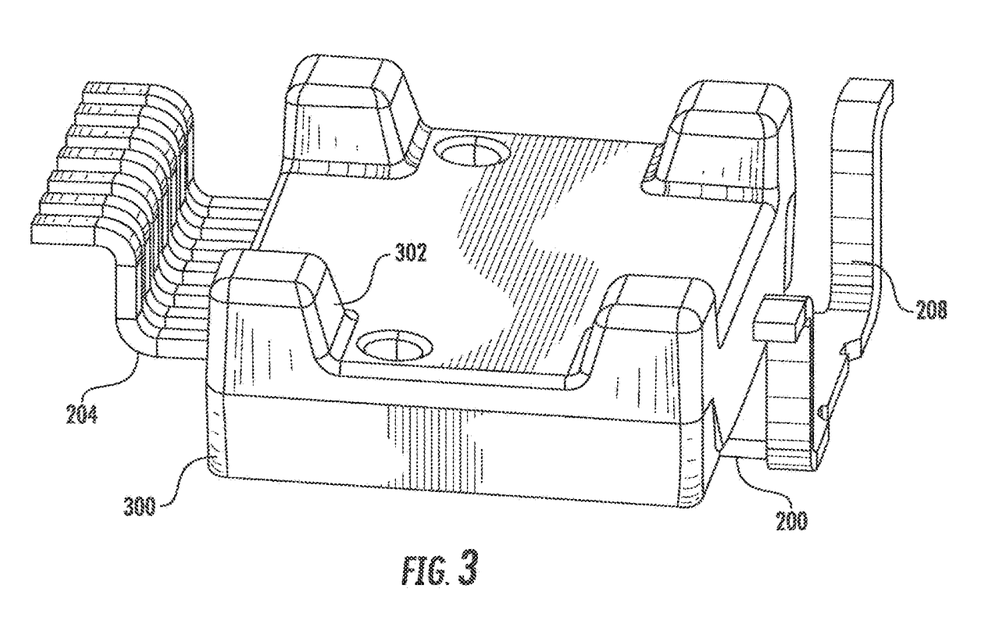
FIG. 3 shows an example of a body that is transfer molded onto the lead frame of FIG. 2 according to one or more embodiments of the present disclosure.

FIG. 3 shows an example of a body 300 that is transfer molded onto the lead frame 200 of FIG. 2. In some implementations, the lead frame 200 is first positioned in a molding IC die so as to present the inside of the top-side base plate 106, with the IC die 202 mounted thereon. A molding material, such as a resin, can then be introduced into the cavity of the molding IC die and therefore be formed into the shape of the body 300. For example, this can involve essentially over molding the body 300 onto the lead frame so that the top-side base plate (obscured in this illustration) remains exposed, and so that the pins 204 and the leads 208 extend from the resulting device package. For example, one or more legs 302 can be formed in the body 102 as part of the molding.

Figure 4:
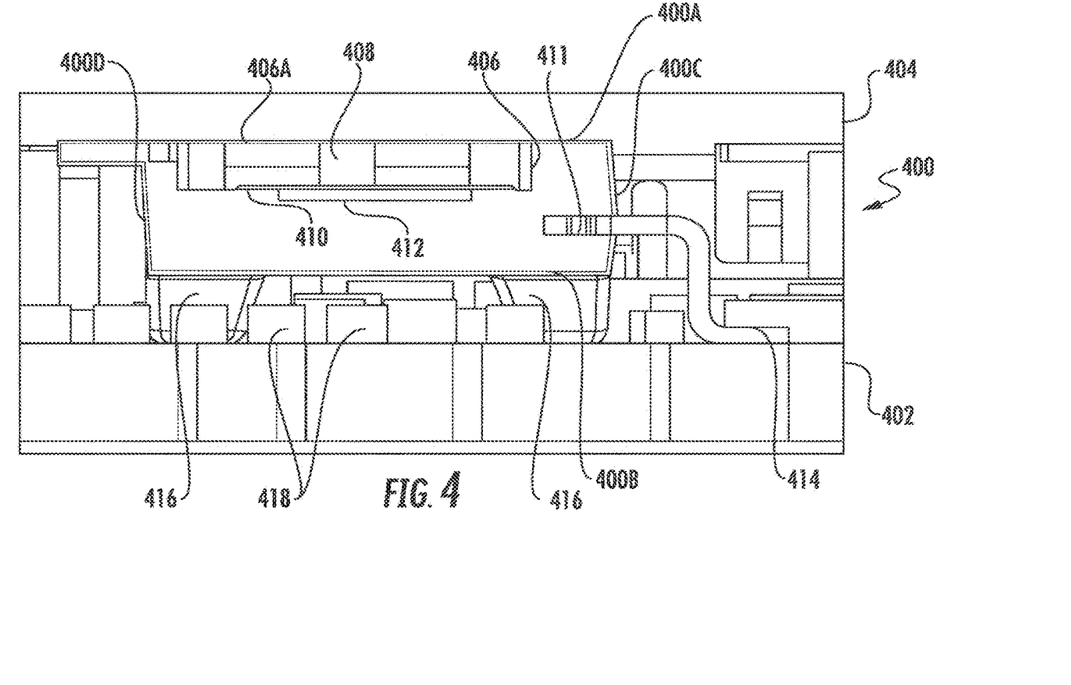
FIG. 4 shows a cross section of an example of a device installed on a PCB with a heatsink according to one or more embodiments of the present disclosure.

FIG. 4 shows a cross section of an example of a device 400 installed on a PCB 402 with a heatsink 404 according to one or more embodiments of the present disclosure. The device 400 here has a body that is in part defined by respective top wall 400A, bottom wall 400B, and side walls 400C and 400D. The device 400 has a lead frame that in this example is partially enclosed by the body so as to form the packaging for the device. A top-side base plate surface 406A of the lead frame is not covered by the body and therefore remains exposed to the outside of the device 400; in this example, the surface faces the heatsink. The top-side base plate 406 can have one or more teeth 408, such as on the edge of the top-side base plate.

An IC die bed 410 is formed on the lead frame, such as at a center of the inside of the top-side base plate. Here, an IC die 412 is mounted onto the lead frame on the IC die bed. Pins 414 include ends 411, and extend between the PCB and the inside of the device for connection (not shown) to the IC die.

The body of the device has one or more legs 416. In some implementations, the legs can provide further separation of the heatsink 404 from the PCB 402 by raising the device above the surface. In some implementations, the legs 416 can facilitate placement of one or more components 418 on the PCB underneath the device.

Figure 5:
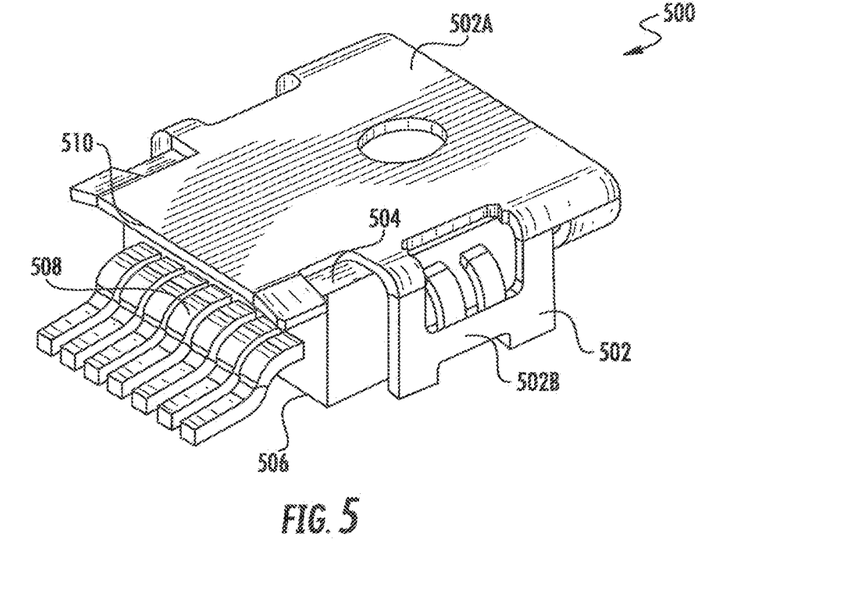
FIG. 5 shows another example of a device where a clip is mounted onto a top-side base plate of a package according to one or more embodiments of the present disclosure.

FIG. 5 shows another example of a device 500 where a clip 502 is mounted onto a top-side base plate of a packaged example device 506 according to one or more embodiments of the present disclosure. Pins 508 extend between the IC die (inside the packaged device 506) and the PCB (not shown). In some implementations, this device 500 is one that was originally designed to have the top-side base plate facing downward onto the PCB, with the pins 508 originally extending from inside the packaged device 506 and toward the plane of the heat transfer surface, because that would orient the pins 508 toward the intended leads or other connection points on the PCB. Then, the design has in a sense been reversed so that the pins 508 instead point in a direction away from the plane of the top-side base plate 504. This allows the device 500 to be installed essentially upside down on the PCB so as to expose the top-side base plate surface upward while having the pins extend toward the PCB.

One or more heat-transferring elements can be added to the device 500. Here, the clip 502 is installed onto the packaged device 506. In some implementations, the clip 502 can have a main surface 502A that faces the top-side base plate, and legs 502B extending over the side of the device 500 on each side thereof. For example, the legs 502B can be soldered onto the PCB. The clip 502 can serve to spread heat from the IC die (transferred through the top-side base plate) over a larger surface and optionally into a heatsink. For example, a top surface 510 (bounded by its periphery) here indicates the surface that is available for heat transfer.

The legs 502B here have inward-curved ribs that grip the packaged device 506 of the device 500 to secure the clip 502. For example, each leg 502B can have one or more ribs. As another example, at the rear in this illustration the clip 502 has an arm on each side. The arms are here partially obscured because they have been folded over to secure the clip 502 to the packaged device 506, analogous to a staple. Accordingly, one or more ways of securing the clip 502 and the packaged device 506 to each other can be used.

Figure 6:
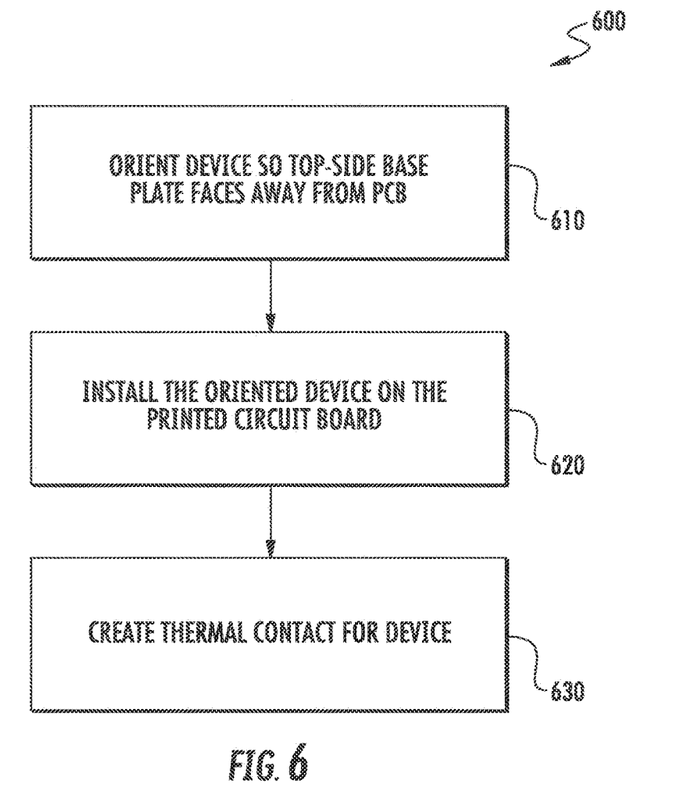
FIGS. 6-8 show examples of methods according to one or more embodiments of the present disclosure.
Figure 7:
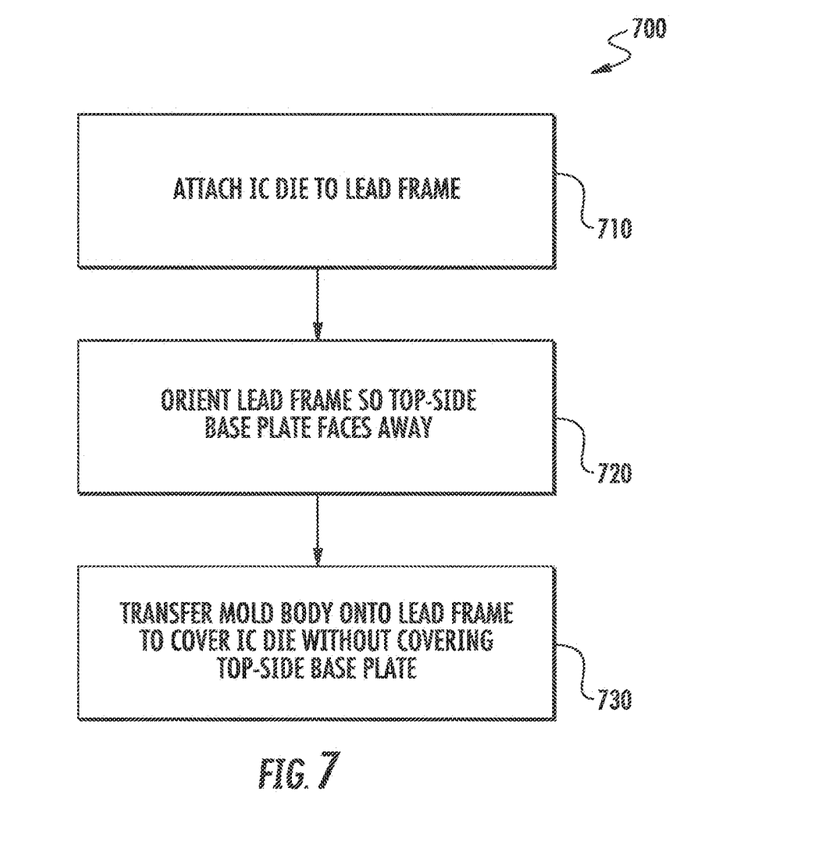
Figure 8:
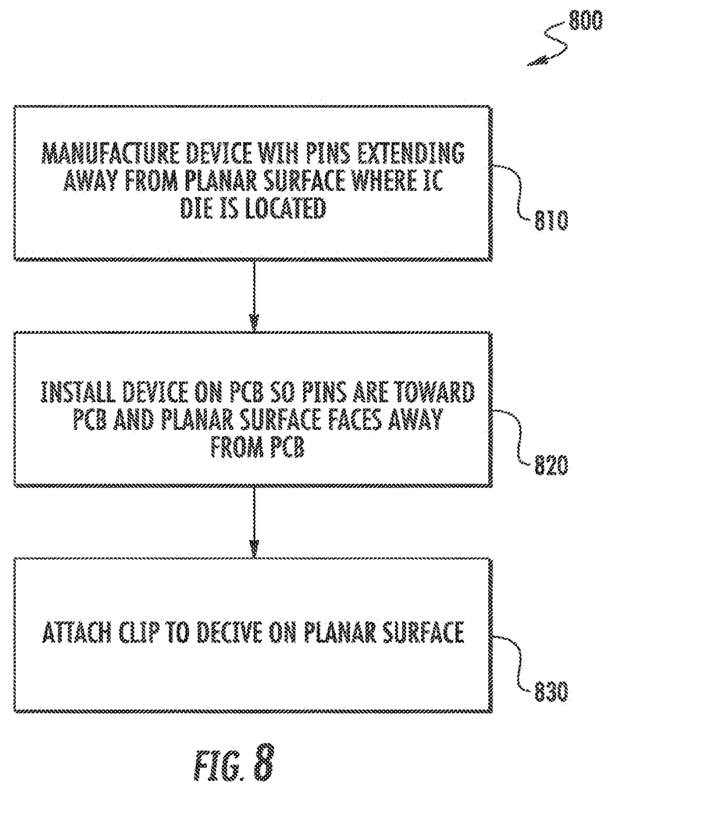

FIG. 6-8 show examples of methods according to one or more embodiments of the present disclosure FIG. 6-8 show examples of methods 600, 700 and 800. Any or all of the methods can be performed when assembling an electronic system that has one or more packaged devices. In some implementations, one or more of the methods can more or fewer operations. As another example, two or more operations can be performed in a different order. The operations will be exemplified using references to parts of illustrations described above.

At 610, a device can be oriented so that a top-side base plate faces away from a PCB. For example, the device 100 can be placed in the position of FIG. 1A. As another example, the device 500 can be placed in the position of FIG. 5.

At 620, the oriented device 100 can be installed onto the PCB. For example, the device 400 (FIG. 4) can be installed onto the PCB 402. As another example, the device 500 (FIG. 5) can be installed onto a PCB.

At 630, thermal contact for the device can be created. For example, the heatsink 404 (FIG. 4) can be placed in contact with the top-side base plate 406A. As another example, the clip 502 (FIG. 5) can be placed across the top-side base plate of the device 500.

Accordingly, the method 600 can provide for installation of a device 100 onto a PCB for improved thermal management of the device.

Turning now to the method 700, at 710 an IC die can be attached to a lead frame. For example, the IC die 202 (FIG. 2) can be attached to the IC die bed 206 of the lead frame 200.

At 720, the lead frame can be oriented so that a top-side base plate thereof faces away. For example, the lead frame 200 can be positioned as shown in FIG. 2 inside a molding IC die having a cavity that corresponds to the intended shape of a body for the device.

At 730, a body can be transfer molded onto the lead frame. This can be done so as to cover the IC die without covering the top-side base plate. For example, the body 300 (FIG. 3) can be over molded onto the lead frame 200.

Accordingly, the method 700 can provide for manufacturing of a device that exposes the heat transfer surface of the IC die, wherein that device is configured for installation with the top-side base plate facing away from the PCB.

In the method 800, finally, at 810 a device can be manufactured with pins extending away from a planar surface where an IC die is located. For example, the device 500 (FIG. 5) can be manufactured so that the pins 508 extend away from the plane of the heat transfer surface and toward the opposite side of the packaging.

At 820, the device can be installed on a PCB so that the pins are toward the PCB and the planar surface faces away from the PCB. For example, the device 500 can be installed on a PCB in the orientation of FIG. 5.

At 830, a clip is attached to the device on at least the planar surface. For example, the clip 502 (FIG. 5) can be mounted onto the device 500 so that the main surface 502A is against the top-side base plane and the legs 502B extend down the sides of the packaging and meet with the PCB.

Accordingly, the method 800 can provide for installation of a device that exposes the heat transfer surface of the IC die, wherein that device is configured for installation with the top-side base plate facing away from the PCB.

Figure 9A:
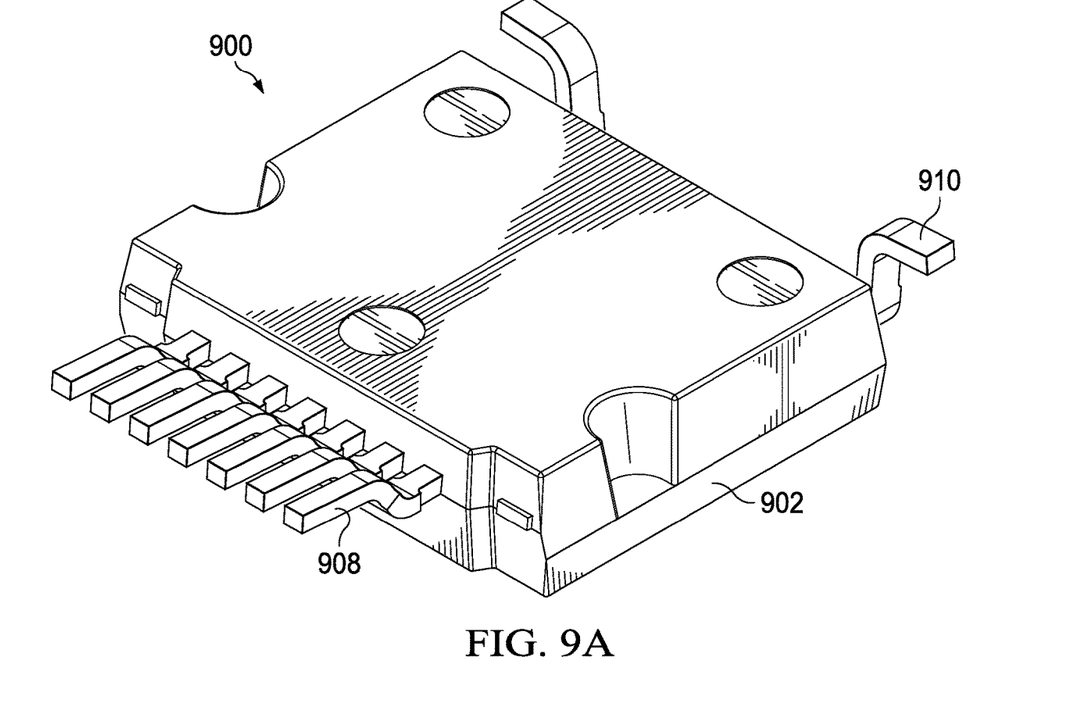
FIGS. 9A-C show respective perspective views of another example of a device constructed according to one or more embodiments of the present disclosure.
Figure 9B:
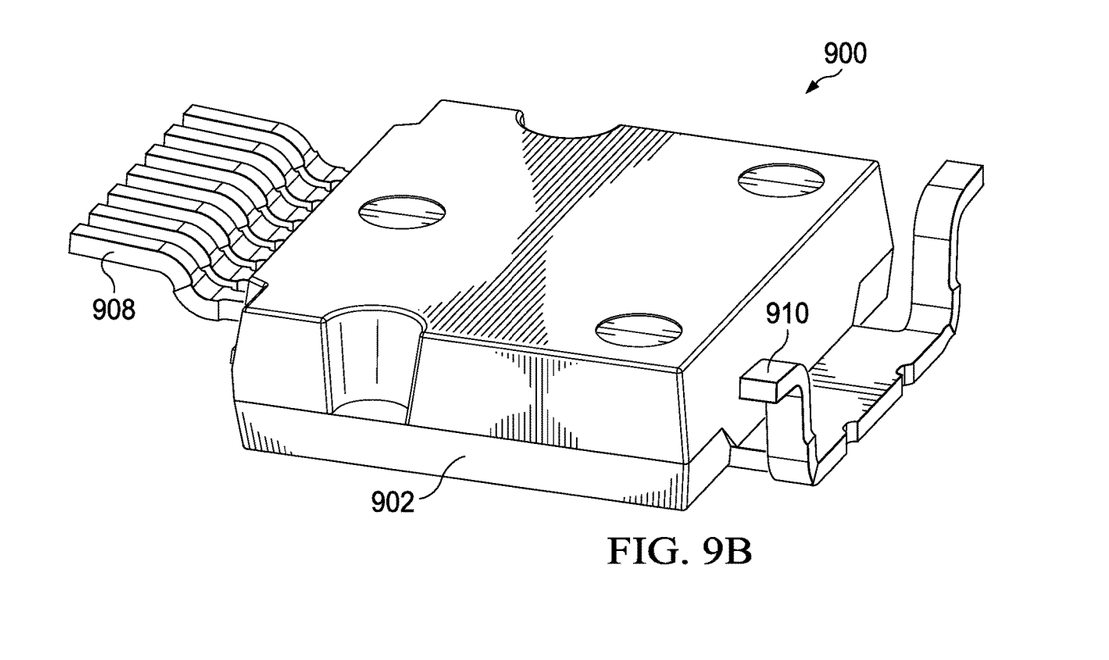
Figure 9C:
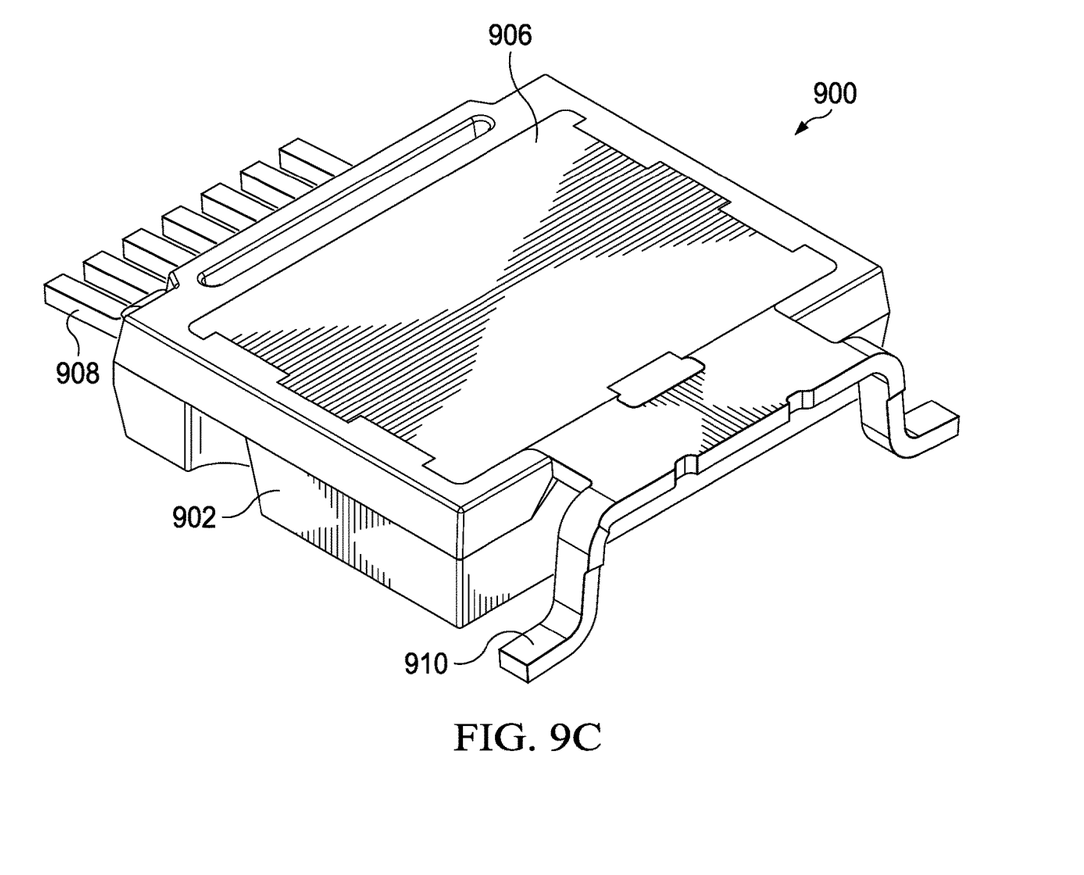

FIGS. 9A-C show respective perspective views of another example of a device 900 constructed according to one or more embodiments of the present disclosure. FIG. 9C shows the device 900 in an orientation for placement onto the top of an essentially horizontal surface, such as a PCB (not shown). FIGS. 9A and 9B show the device 900 from the opposite view, as if viewed from the perspective of the PCB (not shown). These orientations are shown for illustrative purposes only. As contrasted to the device 100 of FIG. 1A through FIG. 4, the device 900 of FIGS. 9A-C has no legs and the device mounts flat and closer to the PCB than the device 100 of the prior FIGS.

The device 900 has a body 902. In some implementations, the body 902 is a molded part, for example made from a resin. The body 902 forms the packaging for the device 900 and serves to enclose certain parts thereof while allowing other parts to be exposed for thermal and/or electrical connection.

The device 900 also has a top-side base plate 906, as shown particularly in FIG. 9C. The top-side base plate 906 is referred to as a top-side base plate 906 because it is positioned on the top of the device 900 relative to the PCB. The top-side base plate 906 can be part of a lead frame for the device 900. In some implementations, the top-side base plate 906 is made of metal, such as copper. The top-side base plate 906 can provide electric and/or thermal contact for the device 900.

An IC die (not shown in FIGS. 9A-C but shown in FIG. 10) is positioned inside the body 902, on an opposite side of the top-side base plate 906. In some implementations, the IC die is directly or indirectly attached to the inward surface of the top-side base plate 906. As such, the top-side base plate 906 can receive a significant share of the heat generated by the IC die in operation. For example, the top-side base plate 906 can be considered the main heat transfer surface of the device 900. As is described below, the position of the top-side base plate 906 on top of the body 902 can facilitate efficient heat removal through the top-side base plate 906.

Figure 10:
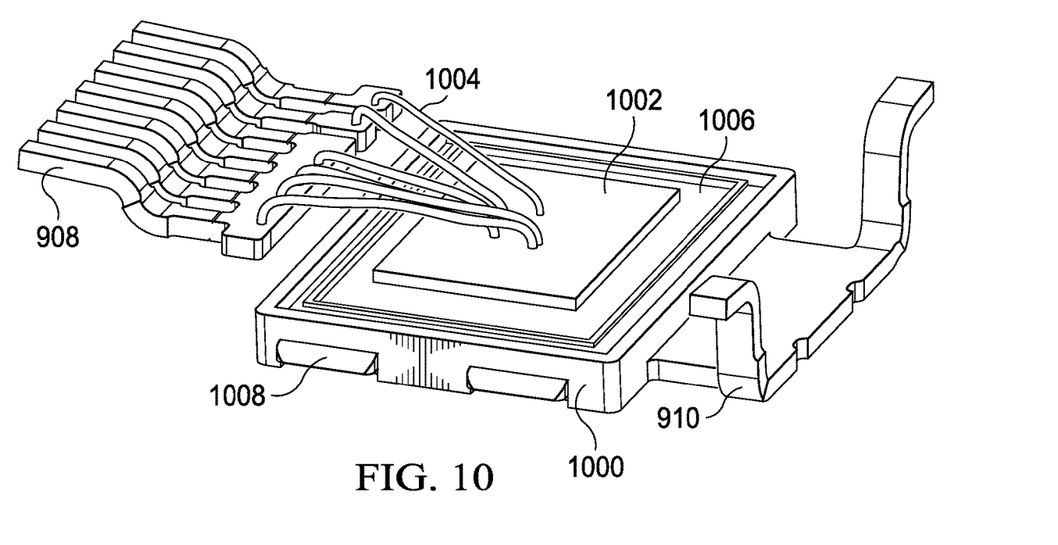
FIG. 10 shows another example of a lead frame, an IC die, and pins according to one or more embodiments of the present disclosure.

The device has pins 908 extending from the body 902, which are electrical connections to/from the IC die. In some implementations, the pins 908 have an arrangement corresponding to respective leads on the PCB (not shown), to facilitate connection of each individual pin. For example, the device 900 can have a standard 7-pin solder connections to the PCB. Inside the body 902 of the device 900, the other ends of the pins 908 are connected to respective terminals on the IC die, for example by wire bonding, as shown in FIG. 10. That is, the pins 908 can in a sense originate at or near the IC die on the inside of the top-side base plate 906 and can then extend in a direction away from the plane of that heat transfer surface so that they can be soldered to the PCB.

The top-side base plate 906 can have one or more leads 910. Here, the top-side base plate 906 has one or more leads 910 that can facilitate thermal and/or electrical connection of the top-side base plate, such as to the PCB. In some implementations, the leads 910 can extend from an edge of the top-side base plate 906. For example, the edge can overhang one of the sides of the body 902. The leads 910 can be formed as an integral part of the top-side base plate 906 or can be attached thereto.

That is, the device 900 can provide the advantage that the top-side base plate 906 is facing away from the PCB and is therefore more susceptible to have heat removed from it. Another advantage can be that the body 902 exposes essentially no conductive surfaces on its side walls, such as by the absence of copper surfaces. For example, the edges of the top-side base plate 906 can be enclosed by the body 902 so that only the top surface thereof is exposed. In some implementations, this can facilitate a closer placement of the device 900 and other components, such as in an array.

The device 900 of FIGS. 9A-9C may be installed with a clip similarly to the device 500 illustrated in FIG. 5. The clip may clip onto the device 900 similarly to the manner in which the clip 502 clips onto the device 500 of FIG. 5.

FIG. 10 shows another example of a lead frame 1000, an IC die 1002, and pins 908 according to one or more embodiments of the present disclosure. The lead frame 1000 is here an integral metal component of a thermally and/or electrically conductive material, such as copper. The lead frame 1000 is shown before being assembled into a device. Here, the IC die 1002 is positioned on a IC die bed 1006 on the inside of the top-side base plate surface. For example, the IC die bed is formed integrally with the lead frame 1000.

The pins 1004 are shown with connections 1004 to the IC die 1002 or the rest of the lead frame, for illustrative purposes, e.g., using wire bond connections. The lead frame 1000 has leads 910 extending from the top-side base plate 906. In some implementations, the leads 910 extend from an edge of the top-side base plate 906 that is intended to overhang a side of the assembled device so as to allow the leads to extend toward the PCB. For example, the leads 910 can be essentially perpendicular to the top-side base plate 906 or the rest of the lead frame 1006. The leads 910 can be soldered to the same PCB as the pins 1004.

The lead frame 1000 can be shaped so as to facilitate the combination with the body 902 into a packaged device. In some implementations, the top-side base plate 906 can have one or more teeth 1008 on its side. For example, these teeth 1008 can interact with a molded part so as to prevent inadvertent dislocation of the top-side base plate 906 and/or the body 902 after installation.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed air vent assembly. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. A device comprising:
   an integrated circuit (IC) die;
   a top-side base plate to which the IC die is mounted, wherein the top-side base plate comprises one or more leads that are formed as an integral part of the top-side base plate and electrically or thermally connect the top side base plate to one or more pads of a printed circuit board (PCB); and
   a body attached to the top-side base plate such that the IC die is inside the body, the body configured for attachment to the PCB such that the top-side base plate faces away from the PCB.

2. The device of claim 1, further comprising a heatsink in contact with the top-side base plate on an opposite side of where the IC die is mounted.

3. The device of claim 1, wherein the body further comprises legs configured for abutting the PCB, the legs positioned on an opposite side of the body from the top-side base plate.

4. The device of claim 3, wherein the legs are configured to provide separation of a heatsink from the PCB.

5. The device of claim 3, wherein the legs are configured to provide space for mounting a component onto the PCB underneath the body.

6. The device of claim 1, wherein the one or more leads on the topside base plate are extending toward and configured for abutting the PCB.

7. The device of claim 6, wherein the top-side base plate has two leads, both positioned on an edge of the top-side base plate that overhangs a side of the body.

8. The device of claim 6, wherein the one or more leads are configured to provide thermal contact between the top-side base plate and the PCB.

9. The device of claim 8, wherein the one or more leads are further configured to provide electrical contact between the top-side base plate and the PCB.

10. The device of claim 1, further comprising a IC die bed on the top-side base plate, wherein the IC die is attached to the IC die bed.

11. The device of claim 10, wherein the IC die is essentially centered on the top-side base plate.

12. The device of claim 1, further comprising a clip configured to essentially cover the top-side base plate on an outside of the body, the clip having at least two clip ends extending down across side of the body and configured for abutting the PCB.

13. The device of claim 12, wherein the body comprises packaging that encloses the IC die.

14. The device of claim 13, wherein the packaging has pins extending in an opposite direction from a planar surface of the packaging where the IC die is located, the pins extending toward, and configured for abutting, the PCB.

15. The device of claim 14, wherein the pins traverse the body and are connected to respective terminals on the IC die by wire bonding.

16. The device of claim 1, wherein the top-side base plate is part of a lead frame made from copper, and wherein the body is made from a resin.

17. The device of claim 1, wherein the device has a 7-pin solder connection to the PCB.

18. The device of claim 1, wherein three edges of the top-side base plate are enclosed by the body such that only a top surface and an edge integrally formed with the leads of the top-side base plate are electrically exposed.

19. A device comprising:
    an integrated circuit (IC) IC die;
    a lead frame to which the IC die is mounted, the lead frame forming a top-side base plate configured to face outward from the device, wherein the top-side base plate comprises one or more leads that are formed as an integral part of the top-side base plate and electrically or thermally connect the top side base plate to one or more pads of a printed circuit board (PCB); and
    a body attached to the top-side base plate such that the IC die is inside the body and the top-side base plate is exposed and faces outward from the device, the body configured for attachment to the PCB such that the top-side base plate faces away from the PCB.

* * * * *

UNITED STATES PATENT AND TRADEMARK OFFICE
CERTIFICATE OF CORRECTION

PATENT NO. : 10,658,276 B2  
APPLICATION NO. : 15/434133  
DATED : May 19, 2020  
INVENTOR(S) : William Thomas Chi Page 1 of 1

It is certified that error appears in the above-identified patent and that said Letters Patent is hereby corrected as shown below:

In the Drawings

In sheet 6 of 9, FIG. 8, reference numeral 810, Line 1, delete "WIH" and insert --WITH--.

In sheet 6 of 9, FIG. 8, reference numeral 830, Line 1, delete "DECIVE" and insert --DEVICE--.

In the Specification

In Column 4, Line 6, delete "FIGs.)" and insert --FIGS.)--.

In Column 6, Line 21, delete "FIG." and insert --FIGS.--.

In Column 6, Line 22, delete "FIG." and insert --FIGS.--.

In the Claims

In Column 10, Line 50, Claim 19, delete "(IC) IC" and insert --(IC)--.

Signed and Sealed this  
Eighth Day of December, 2020

Andrei Iancu  
*Director of the United States Patent and Trademark Office*